US011631678B2

(12) United States Patent
Tang et al.

(10) Patent No.: US 11,631,678 B2
(45) Date of Patent: Apr. 18, 2023

(54) MEMORY ARRAYS COMPRISING MEMORY CELLS

(71) Applicant: Micron Technology, Inc., Boise, ID (US)

(72) Inventors: Sanh D. Tang, Kuna, ID (US); Martin C. Roberts, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 17/328,776

(22) Filed: May 24, 2021

(65) Prior Publication Data

US 2021/0280586 A1   Sep. 9, 2021

Related U.S. Application Data (63) Continuation of application No. 16/192,462, filed on Nov. 15, 2018, now Pat. No. 11,043,499, which is a (Continued)

(51) Int. Cl.
*H01L 27/108* (2006.01)
*H01L 29/786* (2006.01)

(52) U.S. Cl.
CPC .... *H01L 27/1082* (2013.01); *H01L 27/10858* (2013.01); *H01L 29/78618* (2013.01); (Continued)

(58) Field of Classification Search
CPC .................................................. H01L 27/108
See application file for complete search history.

(56) References Cited

U.S. PATENT DOCUMENTS 3,387,286 A   6/1968 Dennard
5,915,167 A   6/1999 Leedy
(Continued)

FOREIGN PATENT DOCUMENTS

CN         1525549       9/2004
CN       101355085       1/2009
(Continued)

OTHER PUBLICATIONS

Matsubayashi et al., "20-nm-node trench-gate-self-aligned crystalline in-Ga—Zn-Oxide FET with high frequency and low off-state current", IEEE International Electron Devices Meeting (IEDM), Dec. 7-9, 2015, United States, 4 pages.

*Primary Examiner* — Marvin Payen
(74) *Attorney, Agent, or Firm* — Wells St. John P.S.

(57) ABSTRACT

Some embodiments include a memory array having vertically-stacked memory cells. Each of the memory cells includes a transistor coupled with a charge-storage device, and each of the transistors has channel material with a bandgap greater than 2 electron-volts. Some embodiments include a memory array having digit lines extending along a vertical direction and wordlines extending along a horizontal direction. The memory array includes memory cells, with each of the memory cells being uniquely addressed by combination of one of the digit lines and one of the wordlines. Each of the memory cells includes a transistor which has GaP channel material. Each of the transistors has first and second source/drain regions spaced from one another by the GaP channel material. The first source/drain regions are coupled with the digit lines, and each of the memory cells includes a capacitor coupled with the second source/drain region of the associated transistor. Other embodiments are disclosed.

13 Claims, 7 Drawing Sheets

Related U.S. Application Data continuation-in-part of application No. 16/029,248, filed on Jul. 6, 2018, now abandoned.

(60) Provisional application No. 62/537,842, filed on Jul. 27, 2017.

(52) U.S. Cl.
CPC .. *H01L 29/78642* (2013.01); *H01L 29/78681* (2013.01); *H01L 29/78696* (2013.01)

(56) References Cited

U.S. PATENT DOCUMENTS

| | | | |
|---|---|---|---|
| 5,977,580 | A | 11/1999 | Yoon |
| 6,160,284 | A | 12/2000 | Hachisuka |
| 6,191,569 | B1 | 2/2001 | Arbetter et al. |
| 7,663,188 | B2 | 2/2010 | Chung |
| 8,541,826 | B2 | 9/2013 | Pan et al. |
| 8,546,955 | B1 | 10/2013 | Wu |
| 9,230,985 | B1 | 1/2016 | Wu et al. |
| 9,263,577 | B2 | 2/2016 | Ramaswamy et al. |
| 9,698,272 | B1 | 7/2017 | Ikeda et al. |
| 9,704,988 | B2 | 7/2017 | Oh |
| 10,964,701 | B2 | 3/2021 | Sharma et al. |
| 2003/0157763 | A1 | 8/2003 | Endoh et al. |
| 2004/0232466 | A1 | 11/2004 | Bimer et al. |
| 2005/0157583 | A1 | 7/2005 | Hofmann |
| 2007/0158731 | A1 | 7/2007 | Bae et al. |
| 2007/0161277 | A1 | 7/2007 | Baars et al. |
| 2007/0236979 | A1 | 10/2007 | Takashima |
| 2010/0038743 | A1 | 2/2010 | Lee |
| 2011/0033955 | A1 | 2/2011 | Kang |
| 2011/0079836 | A1 | 4/2011 | Lin |
| 2012/0064704 | A1 | 3/2012 | Kim |
| 2012/0075917 | A1 | 3/2012 | Takemura |
| 2012/0147644 | A1 | 6/2012 | Scheueriein |
| 2012/0228688 | A1 | 9/2012 | Matsubayashi |
| 2012/0319201 | A1 | 12/2012 | Sun et al. |
| 2013/0037879 | A1 | 2/2013 | Filippini et al. |
| 2013/0069052 | A1 | 3/2013 | Sandhu |
| 2013/0095580 | A1 | 4/2013 | Or-Bach et al. |
| 2013/0161607 | A1 | 6/2013 | Yoneda et al. |
| 2013/0279276 | A1 | 10/2013 | Schaefer |
| 2014/0035018 | A1 | 2/2014 | Lee |
| 2014/0210026 | A1 | 7/2014 | Karlsson et al. |
| 2015/0048292 | A1 | 2/2015 | Park |
| 2015/0063005 | A1 | 3/2015 | Takemura |
| 2015/0340316 | A1 | 11/2015 | Or-Bach et al. |
| 2016/0049406 | A1 | 2/2016 | Sandhu |
| 2016/0322368 | A1 | 11/2016 | Sun et al. |
| 2017/0012126 | A1 | 1/2017 | Chu-Kung et al. |
| 2017/0018570 | A1 | 1/2017 | Lue et al. |
| 2017/0084624 | A1 | 3/2017 | Lee et al. |
| 2017/0092371 | A1 | 3/2017 | Harari |
| 2018/0197864 | A1 | 7/2018 | Sills |
| 2018/0323199 | A1 | 11/2018 | Roberts et al. |
| 2018/0323200 | A1 | 11/2018 | Tang et al. |
| 2019/0027493 | A1 | 1/2019 | Kimura |
| 2019/0067206 | A1 | 2/2019 | Bedeschi et al. |
| 2019/0067288 | A1 | 2/2019 | Juengling |
| 2019/0103406 | A1 | 4/2019 | Tang et al. |
| 2019/0164985 | A1 | 5/2019 | Lee et al. |
| 2019/0198510 | A1 | 6/2019 | Kim |
| 2020/0105330 | A1 | 4/2020 | Kimura et al. |
| 2020/0111793 | A1 | 4/2020 | Kim et al. |
| 2020/0176465 | A1 | 6/2020 | Tang et al. |
| 2020/0411522 | A1 | 12/2020 | Tang et al. |

FOREIGN PATENT DOCUMENTS

| | | |
|---|---|---|
| CN | 102522407 | 6/2012 |
| CN | 104115226 | 10/2014 |
| CN | 106463510 | 2/2017 |
| CN | 201880025498.3 | 8/2022 |
| EP | 2276035 | 1/2011 |
| EP | 18839130 | 5/2020 |
| EP | 18925720 | 5/2020 |
| EP | 19888754 | 7/2022 |
| KR | 10-2006-0088907 | 8/2006 |
| KR | 10-2012-0033244 | 4/2012 |
| KR | 10-2012-0069258 | 6/2012 |
| KR | 10-2012-0139067 | 12/2012 |
| KR | 10-2014-0097520 | 8/2014 |
| KR | 10-2017-0036877 | 4/2017 |
| TW | 201113984 | 4/2011 |
| TW | 201304074 | 1/2013 |
| TW | 201508963 | 3/2015 |
| TW | 108141333 | 8/2020 |
| TW | 108141333 | 3/2022 |
| WO | WO 2013/095676 | 6/2013 |
| WO | WO 2017/034647 | 3/2017 |
| WO | PCT/US2018/041137 | 11/2018 |
| WO | PCT/US2018/061749 | 8/2019 |
| WO | WO | 8/2019 |
| | PCT/US2018/061749 | |
| WO | PCT/US2018/041137 | 1/2020 |

MEMORY ARRAYS COMPRISING MEMORY CELLS

RELATED PATENT DATA

This patent resulted from a continuation of U.S. patent application Ser. No. 16/192,462 filed Nov. 15, 2018, which is a continuation-in-part application of U.S. patent application Ser. No. 16/029,248 filed Jul. 6, 2018, which claims priority to and the benefit of U.S. Provisional Application Ser. No. 62/537,842 filed Jul. 27, 2017.

TECHNICAL FIELD

Embodiments disclosed herein pertain to memory arrays comprising memory cells.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or nonvolatile. Nonvolatile memory cells can store data for extended periods of time including when the computer is turned off. Volatile memory dissipates and therefore is rapidly refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Some memory cells may include a transistor in combination with a capacitor (or other suitable charge-storage device). The transistor is utilized to selective access the capacitor and may be referred to as an access device. The capacitor may electrostatically store energy as an electric field within capacitor dielectric between two capacitor plates. The electrical state of the capacitor may be utilized to represent a memory state.

DETAILED DESCRIPTION OF EXAMPLE EMBODIMENTS

Integrated memory may be formed in a three-dimensional memory array in which memory cells are vertically stacked one atop another. A region of an example three-dimensional memory array 10 is diagrammatically illustrated in FIG. 1. The memory array 10 comprises a first set of conductive lines extending vertically relative to an underlying supporting substrate 12, and a second set of conductive lines extending horizontally across the memory array. The conductive lines of the first set are labeled as digit lines DL1, DL2, DL3, and DL4; and the conductive lines of the second set are labeled as wordlines WL1, WL2, and WL3. The digit lines extend along columns of the memory array, with such columns being labeled as Column A, Column B, Column C, and Column D. The wordlines extend along rows of the memory array, with such rows being labeled as Row 1, Row 2, and Row 3. Accordingly, and by way of example, FIG. 1 and analogous other figures herein also structurally show Row 2 below Row 1; Row 3 below Row 2; and Columns A, B, C, and D as laterally-spaced vertical columns in the actual (i.e., physical) circuit constructions of the various components that are shown.

Figure 1:
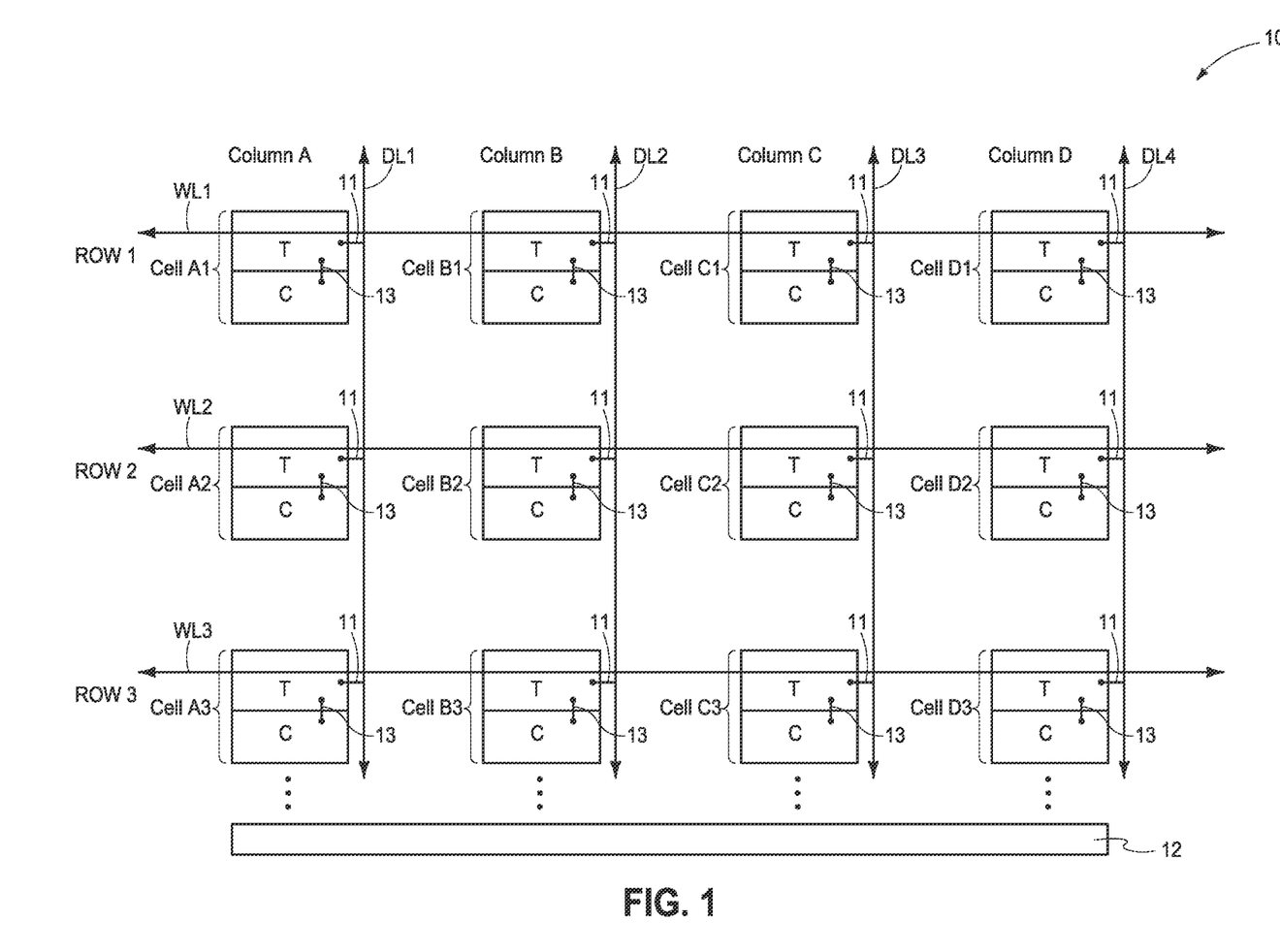
FIG. 1 is a diagrammatic view of a region of an example memory array.

The memory array 10 comprises a plurality of memory cells, with each of the memory cells being uniquely addressed by one of the digit lines and one of the wordlines. The memory cells are labeled with descriptors indicating their locations relative to the rows and columns. For instance, the memory cell along Column A and Row 1 is labeled as Cell A1; the memory cell along Column B and Row 1 is labeled as Cell B1, etc. The memory cells include a transistor (T) in combination with a capacitor (C). Each transistor has a source/drain region coupled with an associated digit line (such coupling is diagrammatically illustrated with lines 11), and has another source/drain region coupled with a storage node of the capacitor (such coupling is diagrammatically illustrated with lines 13). Each transistor also has a gate coupled with a wordline passing across the transistor.

The transistors will include channel material between the source/drain regions (with example channel material being shown and described below with reference to FIG. 2). In some embodiments, it is recognized that it can be advantageous to utilize gallium phosphide (GaP) as channel material within the vertically-stacked memory cells of the memory array 10 of FIG. 1. The GaP may provide advantages of a large bandgap, reasonable mobility of charge carriers, and compatibility with a silicon lattice. In some aspects, it is recognized that GaP may be advantageous over silicon and other semiconductor materials for utilization in the channel regions of the vertically-stacked memory cells due to the large bandgap and the reasonable mobility of charge carriers. Accordingly, it is recognized that it may be advantageous to incorporate GaP into the transistors of the vertically-stacked memory cells.

The GaP channel material may be advantageous in numerous configurations of vertically-stacked memory cells. An example configuration is described with reference to FIG. 2.

Figure 2:
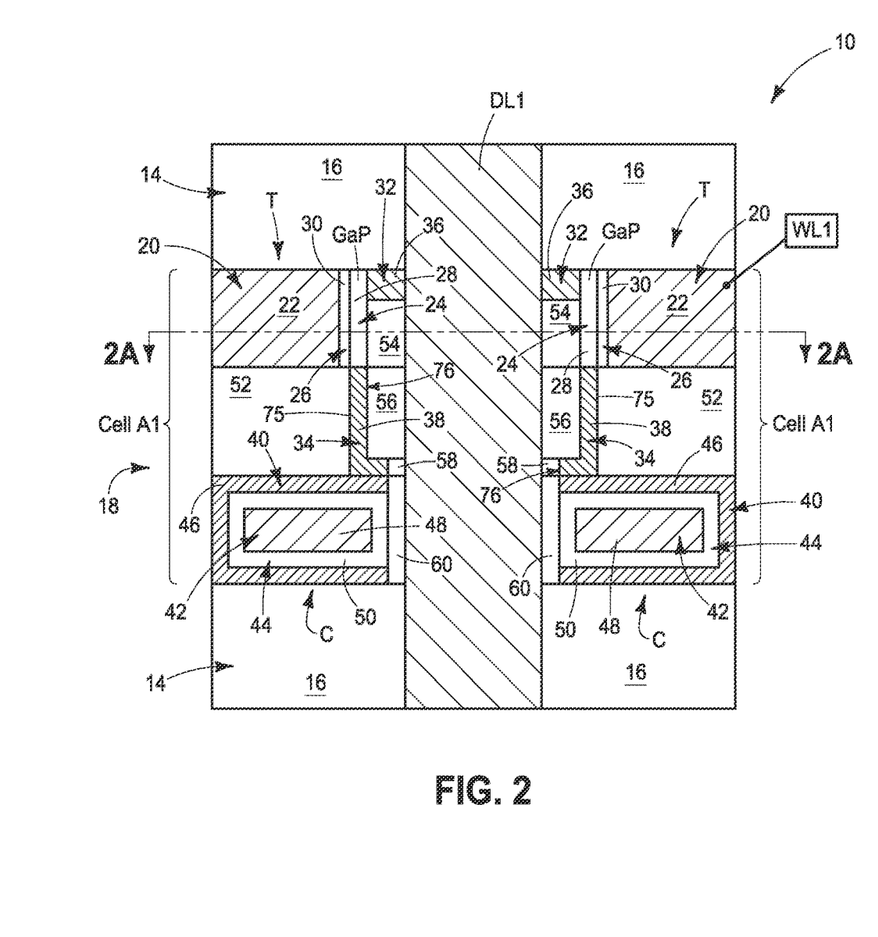
FIG. 2 is a diagrammatic cross-sectional side view of a region of an example memory array and illustrates an example memory cell.

Specifically, FIG. 2 shows an expanded region of a portion of the memory array 10 comprising the Cell A1. The other memory cells of memory array 10 may have a configuration substantially identical to that of the illustrated Cell A1; with the term "substantially identical" meaning identical to within reasonable tolerances of fabrication and measurement.

The illustrated region of memory array 10 includes the digit line DL1 extending vertically through the memory cell A1. Insulative regions 14 are above and below the memory cell A1, with such insulative regions comprising insulative material 16. The insulative material 16 may comprise any suitable composition or combination of compositions; and in some embodiments may comprise, consist essentially of, or consist of silicon dioxide.

In some embodiments, the memory cell A1 may be considered to be part of a memory tier 18 which is vertically between insulative tiers corresponding to the insulative regions 14. The tier 18 may also include the memory cells B1, C1, and D1 of FIG. 1, with such memory cells being horizontally displaced relative to the memory cell A1; and additional memory tiers may be vertically displaced relative to the tier 18, with such additional tiers comprising the memory cells A2, A3, B2, B3, etc., of FIG. 1.

Continuing the description of FIG. 2, the memory cell A1 includes the transistor T and the capacitor C. The transistor T has a gate 20 comprising a conductive gate material 22. The conductive gate material 22 may comprise any suitable electrically conductive materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The transistor T also includes a channel region 24 spaced from the gate 20 by a dielectric region 26.

The channel region comprises channel material 28, which is indicated to include GaP in one embodiment. The GaP may be doped to an appropriate threshold voltage with any suitable dopant, and may be n-type or p-type. Example dopants which may be utilized include arsenic, zinc, sulfur, tellurium, silicon, germanium, tin, etc.

The dielectric region 26 comprises dielectric material 30. The dielectric material 30 may comprise any suitable composition or combination of compositions; and in some embodiments may comprise, consist essentially of, or consist of one or more of silicon dioxide, aluminum oxide, hafnium oxide, etc. In some embodiments, the dielectric material 30 may be referred to as gate dielectric material.

The transistor T includes a first source/drain region 32 and a second source/drain region 34, with the first and second source/drain regions being vertically displaced relative to one another. The source/drain regions 32 and 34 comprise conductive materials 36 and 38, respectively. Such conductive materials may include any suitable composition or combination of compositions; such as, for example, conductively-doped semiconductor material (e.g., conductively-doped silicon), metal (e.g., titanium, tungsten, cobalt, nickel, platinum, etc.), metal-containing compositions (e.g., metal silicide, metal nitride, metal carbide, etc.), etc. Generally, the source/drain regions 32 and 34 do not comprise GaP, but instead comprise conductive material compatible with GaP and suitable for utilization as source/drain regions in a transistor configuration utilizing GaP as channel material. The conductive materials 36 and 38 of source/drain regions 32 and 34 may be the same as one another in some embodiments, and in other embodiments may be different from one another. For instance, in some embodiments the first source/drain region 32 may comprise conductively-doped silicon, and the second source/drain region 34 may comprise metal and/or one or more metal containing compositions.

The digit line DL1 may comprise any suitable electrically conductive material(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first source/drain region 32 is electrically coupled with the digit line DL1, and in the shown embodiment is directly against the digit line DL1.

In some embodiments, there may be no source/drain region 32 contact as shown, but instead GaP 28 may extend to directly contact the digit line DL1. Also, in some embodiments, the digit line DL1 may be constructed to comprise an outer layer of one material (e.g., doped silicon) and an inner core of a second material (e.g., metal or metal-containing material). A structure eliminating the shown source/drain region 32 and instead directly coupling GaP 28 to the digit line DL1 may be built with fewer process steps than the illustrated structure in some applications.

The second source/drain region 34 is electrically coupled with a first electrode (storage node) 40 of the capacitor C. The capacitor C also includes a second electrode 42, and a capacitor dielectric region 44 between the first and second electrodes 40 and 42.

The electrodes 40 and 42 comprise conductive materials 46 and 48, respectively. Such conductive materials may be any suitable materials, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The electrodes 40 and 42 may comprise a same composition as one another, or may comprise different compositions relative to one another.

The capacitor dielectric region 44 comprises dielectric material 50 (which may be referred to as capacitor dielectric material). Such dielectric material may comprise any suitable composition or combination of compositions; and in some embodiments may comprise silicon dioxide, silicon nitride, etc. In some embodiments, the capacitor dielectric material may comprise a ferroelectric material.

The gate 20 of transistor T is spaced from the first electrode 40 of capacitor C by insulative material 52. The insulative material 52 may comprise any suitable composition or combination of compositions; and in some embodiments may comprise, consist essentially of, or consist of silicon dioxide.

A segment of the channel region 24 is spaced from the digit line DL1 by insulative material 54, a segment of the source/drain 38 is spaced from the digit line DL1 by insulative material 56, another segment of the source/drain region 38 is spaced from the digit line by an insulative material 58, and the capacitor C is spaced from the digit line DL1 by an insulative material 60. The insulative materials 54, 56, 58 and 60 may comprise any suitable composition(s) or combination(s) of compositions; and in some embodiments may comprise one or more of silicon dioxide, silicon nitride, etc. The insulative materials 54, 56, 58, and 60 may comprise a same composition as one another, or may comprise different compositions relative to one another. For instance, in some embodiments the insulative material 54 may comprise silicon dioxide, the insulative material 56 may comprise silicon nitride, the insulative material 58 may comprise silicon dioxide, and the insulative material 60 may comprise silicon nitride.

Figure 2A:
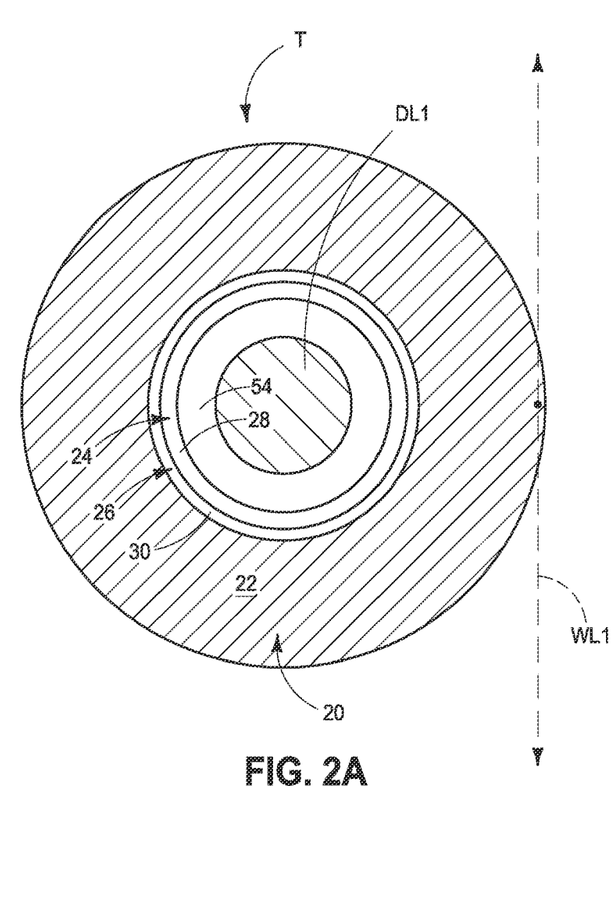
FIG. 2A is a diagrammatic cross-sectional view along the line 2A-2A of FIG. 2.

In some embodiments, the transistor T and the capacitor C may be each configured as a ring surrounding the digit line DL1. For instance, FIG. 2A shows a cross-section along the line 2A-2A of FIG. 2, and shows the transistor T configured as an example ring surrounding the digit line DL1. Specifically, the gate 20 is configured as an outer annular region surrounding an annular region corresponding to the gate dielectric 30, which in turn surrounds an annular region corresponding to the channel material 28, which in turn surrounds an annular region corresponding to the insulative material 54, which in turn surrounds the digit line DL1. The wordline WL1 is coupled with the transistor gate 20, with such coupling being diagrammatically illustrated in FIGS. 2 and 2A.

Figure 3:
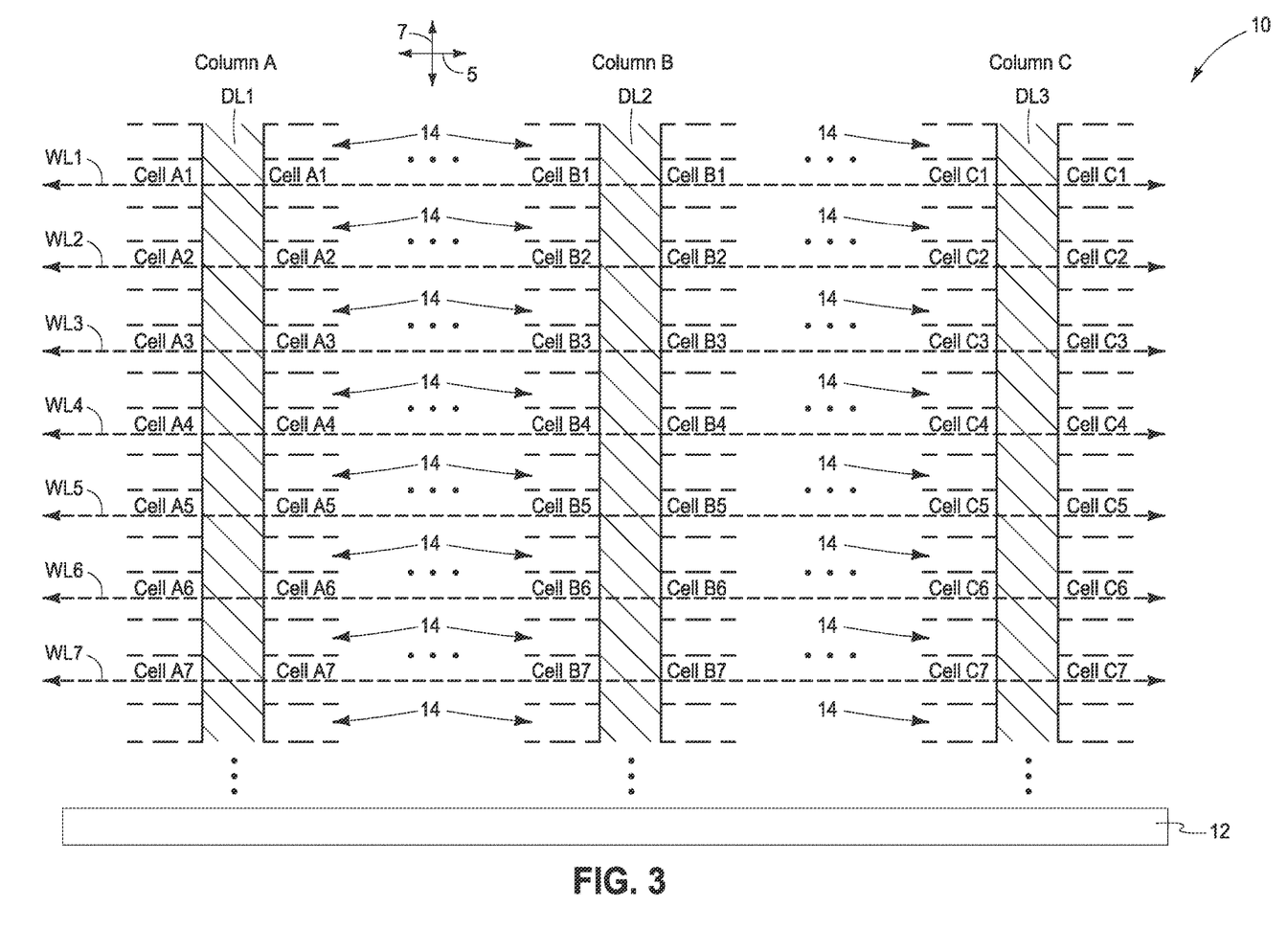
FIG. 3 is a diagrammatic view of a region of an example memory array.

As indicated above, the memory cell A1 may be representative of a large number of substantially identical memory cells utilized in a memory array. FIG. 3 shows a region of an example memory array 10 having digit lines extending along a vertical direction represented by an axis 7, and wordlines extending along a horizontal direction represented by an axis 5. The memory cell A1 is shown to be one of a plurality of substantially identical memory cells extending across the memory array, with each of the memory cells being uniquely addressed by one of the digit lines and one of the wordlines (for instance, the memory cell A1 is uniquely addressed with the digit line DL1 and the wordline WL1). Each of the memory cells may have the configuration described above with reference to FIGS. 2 and 2A, and accordingly may comprise a transistor (e.g., the transistor T of FIG. 2) configured as a ring surrounding a digit line. Each transistor may comprise first and second source/drain regions (e.g., the first and second source/regions 32 and 34 of FIG. 2) spaced from one another by GaP channel material (e.g., the channel material 28 of FIG. 2), with the first and second source/drain regions being vertically displaced relative to one another. Each of the memory cells may also comprise a capacitor (e.g., the capacitor C of FIG. 2) coupled with one of the source/drain regions of the transistor (e.g., coupled with the second source/drain region 34 shown in FIG. 2).

The memory array 10 of FIG. 3 may comprise any suitable number of memory cells, and in some embodiments may comprise hundreds, thousands, millions, billions, etc. of substantially identical memory cells. The memory array 10 of FIG. 3 may be the only memory array associated with a semiconductor chip, or may be one of several memory arrays associated with the chip.

Although the embodiments described above utilize GaP as channel material, in some embodiments it is recognized that it may be advantageous to utilize any suitable channel material having a bandgap greater than 2 electron-volts (eV) at 300 kelvin, with GaP (bandgap about 2.25 eV at 300 kelvin) being an example of a suitable channel material. The channel materials having bandgaps greater than 2 eV may be single compositions, or multiple compositions.

In one embodiment and as shown in FIG. 2, a conductive interconnect 75 directly electrically couples transistor T with one (e.g., 40) of the pair of electrodes (e.g., 40, 42) of capacitor C. In one embodiment and as shown, conductive interconnect 75 may be considered as part of second source/drain region 34 or second source/drain region 34 may be considered as part of conductive interconnect 75. Regardless, and in one embodiment as shown, conductive interconnect 75 comprises opposing L-like shapes 76 that face one another in a straight-line vertical cross-section (e.g., the vertical cross-section that is the plane-of-the-page upon which FIG. 2 lies).

Any other attribute(s) or aspect(s) as shown and/or described herein with respect to other embodiments may be used with respect to the above-described embodiments.

Alternate example channel materials 28 may be used for channel region 24, for example one or more semiconductor oxide(s), and regardless of bandgap of such channel material(s), although ideally channel material 28 has overall bandgap greater than 2 eV. Regardless, and as examples, the semiconductor oxide(s) may comprise any suitable composition, and in some embodiments may include one or more of indium, zinc, tin, and gallium. For instance, the semiconductor oxide may have oxygen in combination with any of indium, zinc, and gallium. The indium, zinc, and gallium are metal(s) within such composition (e.g., a semiconductor metal oxide), and alternate and/or additional metal(s) may be used and the composition need not be or comprise one or more stoichiometric compounds. Regardless, and by way of examples only, some examples include $ZnO_x$, $InO_x$, $In_2O_3$, $SnO_2$, $TiO_x$, $Zn_xO_yN_z$, $Mg_xZn_yO_z$, $In_xZn_yO_z$, $In_xGa_yZn_zO_a$, $In_xGa_ySi_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, and $Zr_xZn_ySn_zO_a$.

Figure 4:
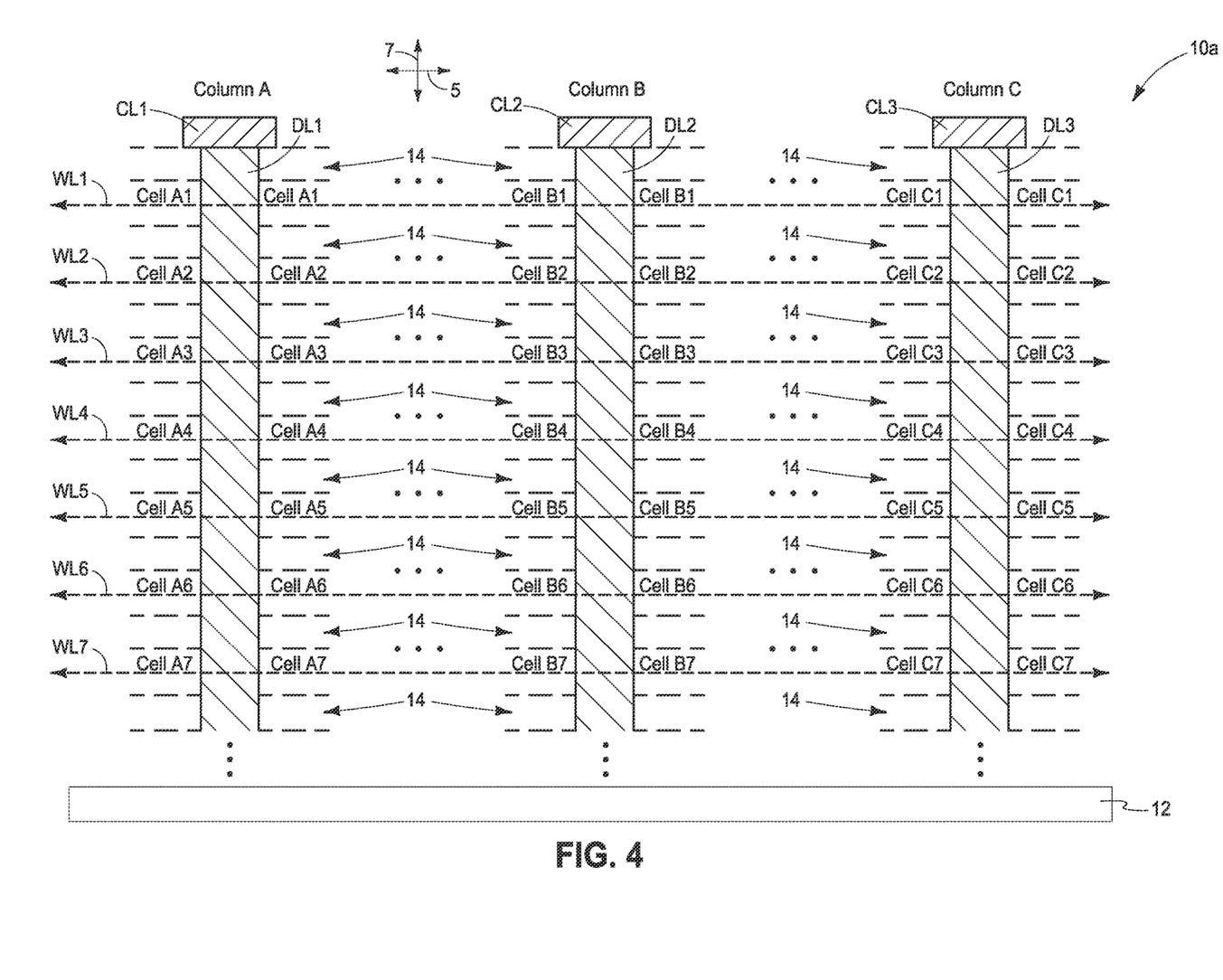
FIG. 4 is a diagrammatic view of a region of an example memory array.
Figure 5:
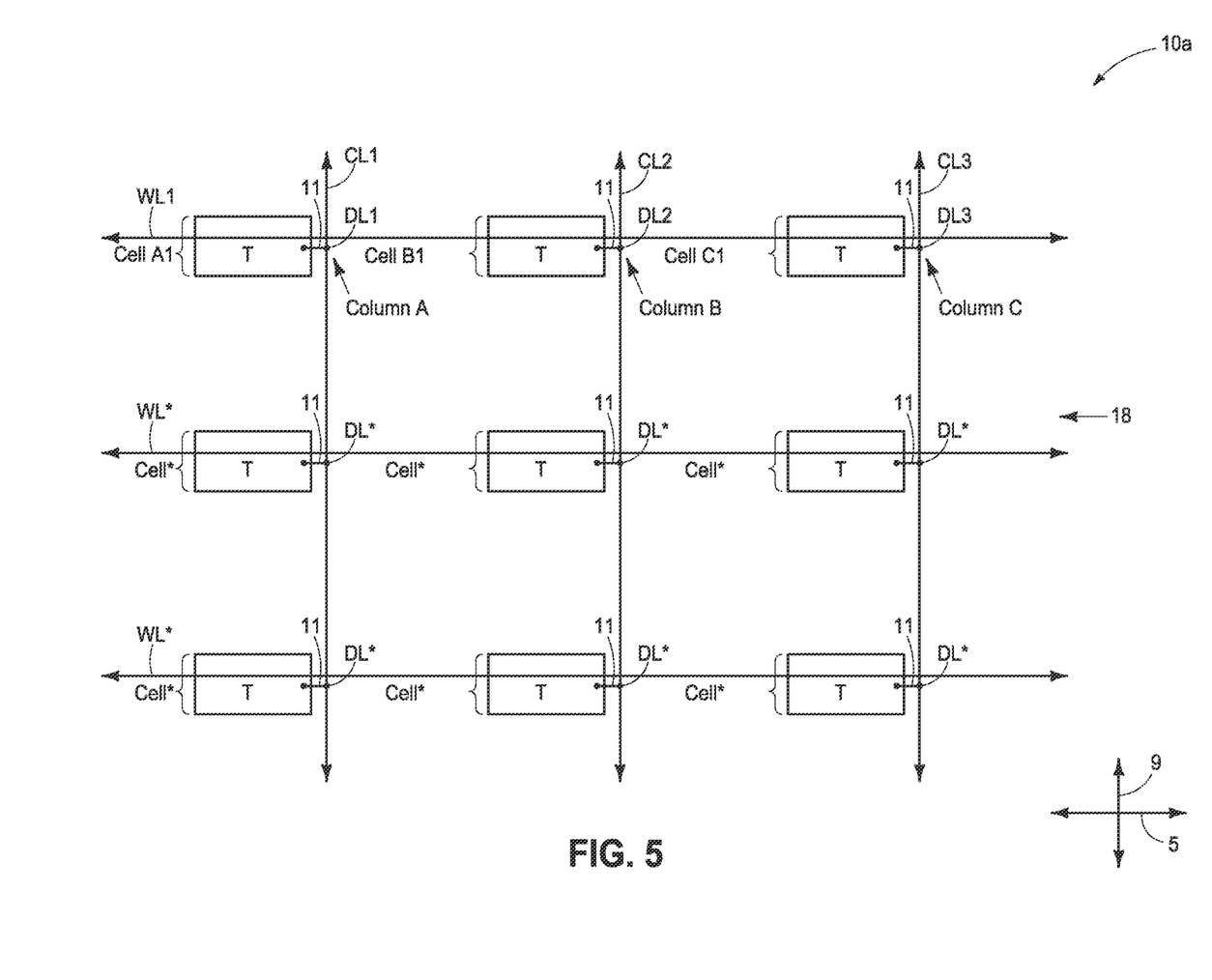
FIG. 5 is a diagrammatic view of a region of an example memory array.

An alternate or additional embodiment three-dimensional memory array 10a is described with reference to FIGS. 4 and 5. Like numerals from the above-described embodiments have been used where appropriate, with some construction differences being indicated with the suffix "a" or with different letters and numerals. In such embodiment, the first conductive lines (e.g., DL1, DL2, DL3, DL*) and the second conductive lines (e.g., WL1-WL7, WL*) individually directly electrically couple with individual of the memory cells (e.g., Cells A1-A7, Cells B1-B7, Cells C1-C7, Cells*). Memory array 10a further comprises a third set of conductive lines (e.g., CL1, CL2, CL3) that extend horizontally (e.g., along axis 9) above or below (above being shown) the memory cells. All of such conductive lines may be above or below the memory cells (as shown in one example) or some of such conductive lines may be above and some of such conductive lines may be below the memory cells (not shown). Conductive lines CL1, CL2, and CL3 of the third set individually directly electrically couple with individual of the vertically-extending conductive lines (e.g., DL1, DL2, DL3, DL*) of the second set. FIG. 5 by way of example only shows example single memory tier 18 wherein transistors T would be above capacitors C in the respective memory cells, with capacitors C thereby not being shown/visible in FIG. 5.

Figure 6:
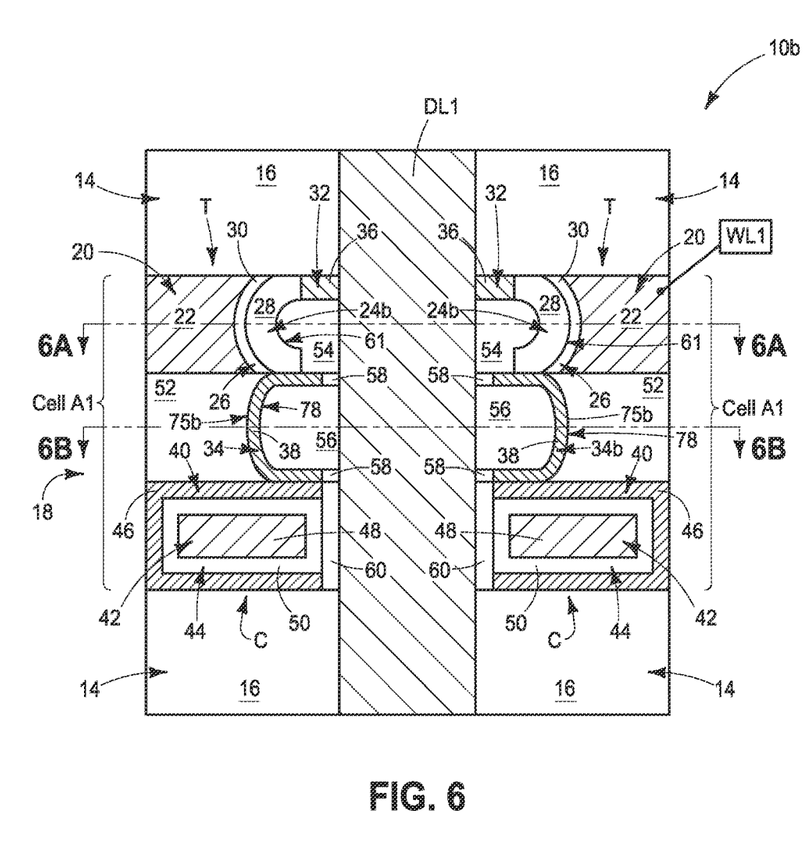
FIG. 6 is a diagrammatic cross-sectional side view of a region of an example memory array and illustrates an example memory cell.
Figure 6A:
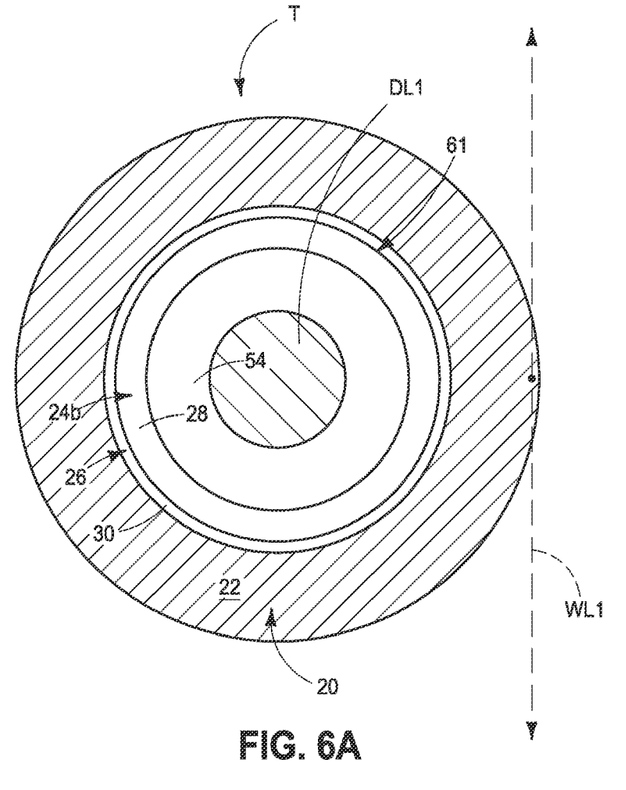
FIG. 6A is a diagrammatic cross-sectional view along the line 6A-6A of FIG. 6.
Figure 6B:
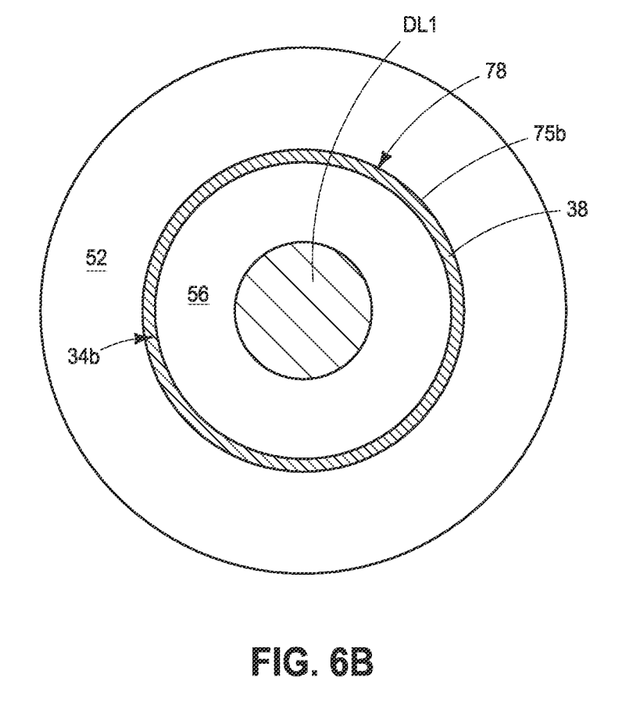
FIG. 6B is a diagrammatic cross-sectional view along the line 6B-6B of FIG. 6.

An alternate embodiment memory array 10b is shown and described with reference to FIGS. 6, 6A, and 6B. Like numerals from the above-described embodiments have been used where appropriate, with some construction differences being indicated with the suffix "b" or with different numerals. FIGS. 6 and 6A show an alternate embodiment channel region 24b as comprising opposing C-like shapes 60 that face one another in a straight-line vertical cross-section, for example the cross-section that is shown as the plane-of-the-page upon which FIG. 6 lies. FIGS. 6 and 6B also show but one alternate example embodiment conductive interconnect 75b that directly electrically couples transistor T with one (e.g., 40) of the pair of electrodes (e.g., 40, 42) of capacitors C. Conductive interconnect 75b comprises opposing C-like shapes 78 that face one another in a straight-line vertical cross-section, for example the cross-section that is the plane-of-the-page upon which FIG. 6 lies.

An embodiment of the invention comprises a memory array (e.g., 10, 10a, 10b) comprising a first set of conductive lines (e.g., DL1, DL2, DL3, DL*) extending along a vertical direction (e.g., 7). A second set of conductive lines (e.g., WL1-WL7, WL*) extends along a horizontal direction (e.g., 5). A plurality of memory cells (e.g., Cells A1-A7, Cells B1-B7, Cells C1-C7, Cells*) is included, with each of the memory cells being uniquely addressed by combination of one of the conductive lines from the first set and one of the conductive lines from the second set. The first and second conductive lines individually directly electrically couple with individual of the memory cells. A third set of conductive lines (e.g., CL1, CL2, CL3) extend horizontally (e.g., in a horizontal direction 9) above or below the memory cells. The conductive lines of the third set individually directly electrically couple with individual of the vertically-extending conductive lines of the second set. Any other attribute(s) or aspect(s) as shown and/or described herein with respect to other embodiments may be used.

A memory array (e.g., 10, 10a, 10b) comprises digit lines (e.g., DL1, DL2, DL3, DL*) extending along a vertical direction (e.g., 7). Wordlines (e.g., WL1-WL7, WL*) extend along a horizontal direction (e.g., 5). A plurality of memory cells (e.g., Cells A1-A7, Cells B1-B7, Cells C1-C7, Cells*) is included, with each of the memory cells being uniquely addressed by combination of one of the digit lines and one of the wordlines. Each of the memory cells comprises a transistor (e.g., T) having channel material (e.g., 28). The transistors are configured as rings surrounding the digit lines. Each of the transistors comprises first and second source/drain regions (e.g., 32 and 34, respectively) spaced from one another by the channel material, and vertically displaced relative to one another. The first source/drain regions are coupled with the digit lines. Each of the memory cells comprises a capacitor (e.g., C) coupled with the second source/drain region of the transistor of the memory cell. Horizontally-extending conductive lines (e.g., CL1, CL2, CL3) are above or below the memory cells. The horizontally-extending conductive lines individually directly electrically couple with individual of the vertically-extending digit lines. Any other attribute(s) or aspect(s) as shown and/or described herein with respect to other embodiments may be used.

An embodiment of the invention comprises a memory array (e.g., 10, 10a, 10b). The memory comprises vertically-alternating tiers (e.g., 14/18/14/18, etc.) of insulative material (e.g., 16) and memory cells (e.g., Cells A1-A7, Cells B1-B7, Cells C1-C7, Cells*). The memory cells individually comprise a transistor (e.g., T) and a capacitor (e.g., C). One of (a) a channel region (e.g., 24, 24b) of the transistor, or (b) a pair of electrodes (e.g., 40, 42) of the capacitor is directly above the other of (a) and (b). In one such embodiment, the channel region is directly above the pair of electrodes (e.g., FIGS. 2 and 6). In another embodiment, the pair of electrodes is directly above the channel region (as would occur or appear if the plane-of-the-page upon which each of FIGS. 2 and 6 lies is rotated 180° [turned upside down]). In one embodiment, the channel region comprises a ring in a straight-line horizontal cross-section, for example the cross-sections that are each of FIGS. 2A and 6A. In one embodiment, the transistor comprises a gate (e.g., 20) comprising a ring in a straight-line horizontal cross-section, for example the cross-sections that are each of FIG. 2A and FIG. 6A. In one embodiment, the channel region comprises opposing C-like shapes (e.g., 60) that face one another in a straight-line vertical cross-section, for example the cross-section that is the plane-of-the-page upon which FIG. 6 lies. Any other attribute(s) or aspect(s) as shown and/or described herein with respect to other embodiments may be used.

An embodiment of the invention comprises a memory array (e.g., 10, 10a, 10b) comprising vertically-alternating tiers (e.g., 14/18/14/18, etc.) of insulative material (e.g., 16) and memory cells (e.g., Cells A1-A7, Cells B1-B7, Cells C1-C7, Cells*). The memory cells individually comprise a transistor (e.g., T) and a capacitor (e.g., C). One of (a) a channel region (e.g., 24, 24b) of the transistor, or (b) a pair of electrodes (e.g., 40, 42) of the capacitor is directly above the other of (a) and (b). The transistor comprises a gate (e.g., 20). The channel region extends elevationally (e.g., vertically) alongside the gate. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Herein, regions-materials-components are "coupled" or "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly coupled" or "directly electrically coupled", no intervening electronic component (e.g., no diode, transistor, resistor, transducer, switch, fuse, etc.) is between the directly coupled or directly electrically coupled regions-materials-components.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is/below under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Unless otherwise indicated, use of "or" herein encompasses either and both.

Some embodiments include a memory array having vertically-stacked memory cells. Each of the memory cells includes a transistor coupled with a charge-storage device, and each of the transistors has channel material with a bandgap greater than 2 electron-volts.

Some embodiments include a memory array having a first set of conductive lines extending along a vertical direction, and a second set of conductive lines extending along a horizontal direction. The memory array includes a plurality of memory cells, with each of the memory cells being uniquely addressed by combination of one of the conductive lines from the first set and one of the conductive lines from the second set. Each of the memory cells includes a transistor having GaP channel material.

Some embodiments include a memory array having digit lines extending along a vertical direction and wordlines extending along a horizontal direction. The memory array includes a plurality of memory cells, with each of the memory cells being uniquely addressed by combination of one of the digit lines and one of the wordlines. Each of the memory cells includes a transistor which has GaP channel material. The transistors are configured as rings surrounding the digit lines. Each of the transistors has first and second source/drain regions spaced from one another by the GaP channel material. The first source/drain regions are coupled with the digit lines. Each of the memory cells includes a capacitor coupled with the second source/drain region of the transistor of the memory cell.

Some embodiments include a memory array having a first set of conductive lines extending along a vertical direction and a second set of conductive lines extending along a horizontal direction. The memory array includes a plurality of memory cells, with each of the memory cells being uniquely addressed by combination of one of the conductive lines from the first set and one of the conductive lines from the second set. The first and second conductive lines individually directly electrically couple with individual of the memory cells. A third set of conductive lines extend horizontally above or below the memory cells. The conductive lines of the third set individually directly electrically couple with individual of the vertically-extending conductive lines of the second set.

Some embodiments include a memory array having digit lines extending along a vertical direction and wordlines extending along a horizontal direction. The memory array includes a plurality of memory cells, with each of the memory cells being uniquely addressed by combination of one of the digit lines and one of the wordlines. Each of the memory cells comprise a transistor having channel material. The transistors are configured as rings surrounding the digit lines. Each of the transistors comprise first and second source/drain regions spaced from one another by the channel material and are vertically displaced relative to one another. The first source/drain regions are coupled with the digit lines. Each of the memory cells comprises a capacitor coupled with the second source/drain region of the transistor of the memory cell. Horizontally-extending conductive lines are above or below the memory cells. The horizontally-extending conductive lines individually directly electrically couple with individual of the vertically-extending digit lines.

Some embodiments include a memory array having vertically-alternating tiers of insulative material and memory cells. The memory cells individually comprise a transistor and a capacitor. One of (a) a channel region of the transistor, or (b) a pair of electrodes of the capacitor, are directly above the other of (a) and (b). The channel region comprises opposing C-like shapes that face one another in a straight-line vertical cross-section.

Some embodiments include a memory array having vertically-alternating tiers of insulative material and memory cells. The memory cells individually comprise a transistor and a capacitor. One of (a) a channel region of the transistor, or (b) a pair of electrodes of the capacitor, are directly above the other of (a) and (b). The transistor comprises a gate. The channel region extends elevationally alongside the gate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array comprising:
a plurality of memory cells, with each of the memory cells comprising a transistor and a capacitor coupled with the transistor, the transistor comprising a gate region, a first source/drain region, a second source/drain region and a channel region between the first and second source/drain regions; the capacitor having an inner electrode and having an outer electrode spaced from the inner electrode by an insulator material; and
a conductive structure extending in a vertical direction, the inner electrode and the outer electrode each being configured as a ring surrounding the conductive structure, the outer electrode being along a top surface, a bottom surface and an outer lateral surface of the inner electrode and being directly coupled with the second source/drain region.

2. The memory array of claim 1, wherein the memory cells comprised the plurality of memory cells are vertically stacked.

3. The memory array of claim 2, wherein the conductive structure is associated with the capacitor of each of the memory cells comprised by the plurality.

4. The memory array of claim 1 wherein the transistors are configured as rings surrounding the conductive structure.

5. The memory array of claim 1 wherein the first and second source/drain regions are a same composition as one another.

6. The memory array of claim 1 wherein the first and second source/drain regions are different compositions relative to one another.

7. The memory array of claim 1 wherein the channel region comprises a GaP material.

8. A memory array comprising:
first conductive lines extending along a vertical direction;
second conductive lines extending along a horizontal direction;
a plurality of memory cells comprising a transistor, each of the transistors comprising first and second source/drain regions spaced from one another by a channel material, and a gate encircling the channel region the first source/drain regions being coupled with digit lines; and
each of the memory cells comprising a capacitor coupled with the second source/drain region of the transistor of the memory cell, the capacitor being configured as a ring surrounding a vertically extending conductive structure.

9. The memory array of claim 8 wherein the channel material comprises a semiconductor metal oxide.

10. A memory array comprising:
vertically-alternating tiers of insulative material and memory cells, the memory cells individually comprising a transistor and a capacitor, a source/drain region of the transistor being in direct electrical contact with an electrode of the capacitor; and
a conductive structure passing vertically through the stack, the conductive structure passing though and being laterally surrounded by each of the capacitors.

11. The memory array of claim 10 wherein the electrode is a first electrode and further comprising a second electrode separated from the first electrode by an insulative material, and wherein each of the first and second electrodes entirely encircle the conductive structure.

12. The memory array of claim 10 wherein the transistor comprises a gate, the gate comprising a ring in a straight-line cross-section.

13. The memory array of claim 10 wherein the gate entirely encircles the channel region.

* * * * *